United States Patent [19]

Hsieh et al.

[11] Patent Number: 5,471,397
[45] Date of Patent: Nov. 28, 1995

[54] IDENTIFYING SUBSETS OF NOISE VIOLATORS AND CONTRIBUTORS IN PACKAGE WIRING

[75] Inventors: Edward P. Hsieh, Bedford Hills, N.Y.; Raghu V. Hudli, Austin, Tex.

[73] Assignee: International Business Machines Corporation, Armonk, N.Y.

[21] Appl. No.: 168,015

[22] Filed: Dec. 15, 1993

[51] Int. Cl.⁶ .................................................. H05K 7/06
[52] U.S. Cl. ........................ 364/489; 364/488; 364/578
[58] Field of Search ................................. 364/488, 489, 364/490, 491, 578; 307/549; 324/158 R; 174/250; 371/20, 22, 23

[56] References Cited

U.S. PATENT DOCUMENTS

| | | | |
|---|---|---|---|
| 4,398,106 | 8/1983 | Davidson et al. | 307/549 |
| 4,594,677 | 6/1986 | Barlow | 364/578 |
| 4,615,011 | 9/1986 | Linsker | 364/491 |
| 4,642,890 | 2/1987 | Hechtman et al. | 364/488 |
| 4,811,237 | 3/1989 | Putatunda | 364/490 |
| 4,823,276 | 4/1989 | Hiwatashi | 364/490 |
| 4,961,010 | 10/1990 | Davis | 307/451 |
| 5,010,493 | 4/1991 | Matsumoto et al. | 364/488 |
| 5,050,091 | 9/1991 | Rubin | 364/490 |
| 5,059,897 | 10/1991 | Aton et al. | 324/158 R |
| 5,111,413 | 5/1992 | Lazansky et al. | 364/488 |
| 5,151,868 | 9/1992 | Nishiyama et al. | 364/488 |
| 5,168,176 | 12/1992 | Waniass | 307/263 |
| 5,198,986 | 3/1993 | Ikeda et al. | 364/489 |
| 5,243,547 | 9/1993 | Tsai et al. | 364/578 |
| 5,288,949 | 2/1994 | Crafts | 174/250 |
| 5,337,252 | 8/1994 | Lac et al. | 364/488 |

*Primary Examiner*—Kevin J. Teska
*Assistant Examiner*—Russell W. Frejd
*Attorney, Agent, or Firm*—Whitham, Curtis, Whitham & McGinn; Alison Mortinger

[57] ABSTRACT

A method for identifying a minimal subset of noise violator nets that can be removed to ensure that no net has quiet noise that exceeds a specified maximum noise. Nets and the coupled noise between them are initially represented in a weighted directed graphical representation. Each net is a vertex in the representation. If a net in its active state causes a coupled noise on a quiet net, there is a directed edge or vector from the vertex of the active net to the vertex of the quiet net.

8 Claims, 4 Drawing Sheets

| Net | Active Noise | Quiet Noise |
|---|---|---|
| $N_1$ | 150 | 240 |
| $N_2$ | 40 | 0 |
| $N_3$ | 80 | 110 |
| $N_4$ | 30 | 0 |
| $N_5$ | 70 | 70 |
| $N_6$ | 20 | 0 |
| $N_7$ | 30 | 0 |

IDENTIFYING SUBSETS OF NOISE VIOLATORS AND CONTRIBUTORS IN PACKAGE WIRING

BACKGROUND OF THE INVENTION

1. Field of the Invention

This invention relates to an improved method for rapidly identifying a minimal subset of interconnection circuits (nets) in a multi-chip-module that must be rerouted in order to bring coupled noise on all nets within a specified limit.

2. Description of the Prior Art

State-of-the-art integrated circuit chips have a very high-level of integration, containing millions of circuits. This high-density results in a large number of terminals (I/O pins) on the chips for communication with other chips. Along with advances in chip technology, packaging technology has made similar technological strides. On a relatively small area on a multi-chip-module (MCM)—approximately 8"×8"—it is possible to package over a hundred chips. Typical MCMs provide 50-75 wiring planes for routing the interconnections between the chips. But, despite the larger number of wiring planes, the high pin count on the chips results in a high density of wires on the planes. The close proximity of the wires in conjunction with the high speed of signals that travel on them results in many kinds of noise—coupling, reflection, cross-talk, Delta-I, etc. This invention addresses the problem of reducing coupled noise to acceptable levels. Coupled noise is the induction of signal by a signal-carrying net or nets onto nearby nets when they are quiet. The coupled noise, if large, can cause false switching of circuits. Hence, it is crucial for the correction operation of high-performance MCMs in computers to keep the noise below certain thresholds.

The known wiring programs that route the interconnection nets of the chips in MCMs, at best, can only estimate the coupled noise that would potentially exist when the connections are actually manufactured. What appears to be a good wiring route can have unacceptable noise problems in the manufactured product. In such situations, it is important to identify and reroute the noisy wires. Since the noise violators usually have strong coupling with other nets, it follows that these noise violator nets also contribute noise to other nets. When a noise violator is rerouted, the noise on one or more other noise violators is often reduced—sometimes to acceptable levels. Hence, it is usually sufficient to reroute only a subset of noise violators in order reduce the noise on all nets on the MCM to acceptable limits. Another solution to the noise problem is to rip-up the nets that contribute a high amount of noise to the coupled nets. Again, it is important to note that when a noise contributing net is ripped-up, it often reduces noise on more than one noise violators. After the subset of noise violators is identified, they can be rerouted in less congested areas, or they can be removed and routed with discrete wires, reducing the number of noise violators on the package to zero. Manufacturing and other consideration limits the number of discrete wires that can be wired on a package; therefore, it is desirable to identify the smallest subset of wires to be rewired so that the noise on the package has the largest reduction.

There is no router program that can guarantee zero noise violations. One reason is the imperfect modeling of the actual noise that can exist after the packages are manufactured. All routing programs produce less than optimal wiring. So a typical MCM package has a number of nets with noise that exceeds the specified limits for noise (i.e., noise violators). Hence, it becomes essential to identify a subset of noise-violators to be ripped-up and rerouted with tighter wiring constraints, or to be wired as discrete wires. It is estimated that a skilled designer can manually resolve up to six noise violations per day, using prior art procedures. The prior art method is mainly manual. Noisy nets are identified, which are then manually rerouted—with no knowledge of how the noise on other nets is changing. Noise is calculated at the end of rerouting phase of all nets. The calculations give a new list of noisy nets—possibly a longer list than before. Nets are again ripped-up and rerouted. This cycle of rerouting and noise calculation is carried out until there are no more noisy nets. Hence, it is advantageous to automate the process, for reasons of time and money. But, unfortunately, as mentioned below, the problem of finding the smallest such subset is not susceptible to a mathematical solution. Further, the problem has no scheme for an approximate solution.

The problem addressed by this invention can be stated as follows:

Statement 1. Given a package P with a set of noise violators N, find a subset M of N such that if the nets in M are deleted, then there are no noise violators on P.

Statement 2. Given a package P, and a limit D on the number of discrete wires that can be wired on the package, and a set of noise violators N, find a subset M of N such $|M| \leq D$ and that the deletion of nets in M results in the least number of remaining violators:

Wherein the terms are defined as follows:

1. Active Net: A net carrying signal that contributes noise to neighboring nets via coupling.
2. Quiet Net: A net receiving coupled noise from an active net.
3. Active Noise: The total noise contributed by an active net to all noise violators.
4. Quiet Noise: The total noise coupled onto a quiet net.
5. Noise Violator: A net whose quiet noise exceeds the threshold noise as specified by the technology.
6. Noise Contributor An active net that has a noise-coupling with another net.

It can be seen that Statement 2 is a generalization of Statement 1. If D is zero and if the number of remaining violators is to be zero, then Statement 2 reduces to Statement 1. It can be shown that Statement 1 is NP-complete, meaning that there is no known deterministic way to find a solution to an instance of the problem in time that is polynomial in the size of the statement. It can be shown that the independent set problem is an instance of Statement 1. The independent set stated is NP-complete. It has been shown that there are no approximation schemes for the independent set stated, hence implying that no approximation scheme exists for solving Statement 1.

SUMMARY OF THE INVENTION

One object of this invention is the provision of a method to provide a fast identification of a minimal subset of nets that must be rerouted in order to bring coupled noise on all nets to specified limits.

Another object of the invention is the provision of a method that provides cluster information concerning noisy nets.

A further object of the invention is a noise subset identification method that can be implemented in a computer program.

Briefly, this invention contemplates a method for identifying a minimal subset of noise violator nets that can be removed to ensure that no net has quiet noise that exceeds a specified maximum noise. Nets and the coupled noise between them are initially represented in a weighted directed graphical representation. Each net is a vertex (also referred to herein as a node) in the representation. If a net in its active state causes coupled noise on a quiet net, there is a directed edge or vector from the vertex of the active net to the vertex of the quiet net. The amount of noise is represented as weight on the edge. The amount of quiet noise on a net is the sum of the weights on all the incoming edges to the net vertex, and the amount of the active noise of the net is the sum of the weights on all edges going out of the vertex. Noise violators are processed on the basis of a priority assigned to each net that is a function of the noise on the net. Noise violators are initially picked for deletion from a priority queue, such as a heap tree in which the priority of any node is greater than the priority of either the left or right child. For suitable priority algorithm see, for example, T. H. Cormen, C. E. Leiserson and R. L. Rivest, "Introduction to Alqorithms" MIT Press., 1990, which is incorporated herein by reference. In a heap tree, the root of the tree has the highest priority of all the nodes in the queue, and any operation on the queue provides that, for every node, its priority is greater than the priorities of the left and right child. As noise violators are picked in a prescribed order for deletion, a noise violator initially picked for deletion may eventually become a non-violator due to the subsequent deletion of other noise contributing noise violators. For this reason, deleted noise violators are provisionally reinstated from the deleted set of original noise violators, after the target of reducing quiet noise on all nets to a specified level has been achieved.

The process identifies clusters of nets (i.e., those nets that are coupled electrically) and the amount of coupling between these nets. This cluster information is valuable as it is often sufficient to delete a small subset of nets in each cluster in order to reduce the noise to an acceptable level. Thus, rather than looking at all the nets, it may be sufficient to deal with only the individual clusters and delete a small subset of noise violators from the cluster.

Three alternative procedures are disclosed. In one procedure, the amount of quiet noise on a node is the priority criteria and the node which contributes the highest amount of noise to this priority node is deleted along with the edges emanating from the deleted node. The quiet noise is then recalculated for all remaining nodes and the nodes are reprioritized on the basis of this recalculation.

In another procedure, the amount of active noise on a node is the priority criteria, and the highest priority node is deleted along with degree emanation from the node. The quiet noise is then recalculated for all remaining nodes and the nodes are reprioritized on the basis of this recalculation.

In the third procedure, the amount of quiet noise on a node is the priority criteria, and the node contributing noise to this priority node with the highest active noise is deleted. Again, the quiet noise is then recalculated for all remaining nodes, and the nodes are reprioritized on the basis of this recalculation.

The common feature of each of these procedures is that they identify a subset of nets for rerouting. They each generate cluster information, but the specific subset identification may be different for different wiring designs. The procedure that yields the smallest subset to be rerouted should be chosen. The identified subset can be removed and rerouted with stricter wiring constraints to prevent new noise violations. If not all noise violators can be rerouted to prevent all noise violations, then yet a smaller subset of nets can be wired as discrete wires to eliminate noise coupling with an aim of providing zero noise violators and a reduction of total MCM noise.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
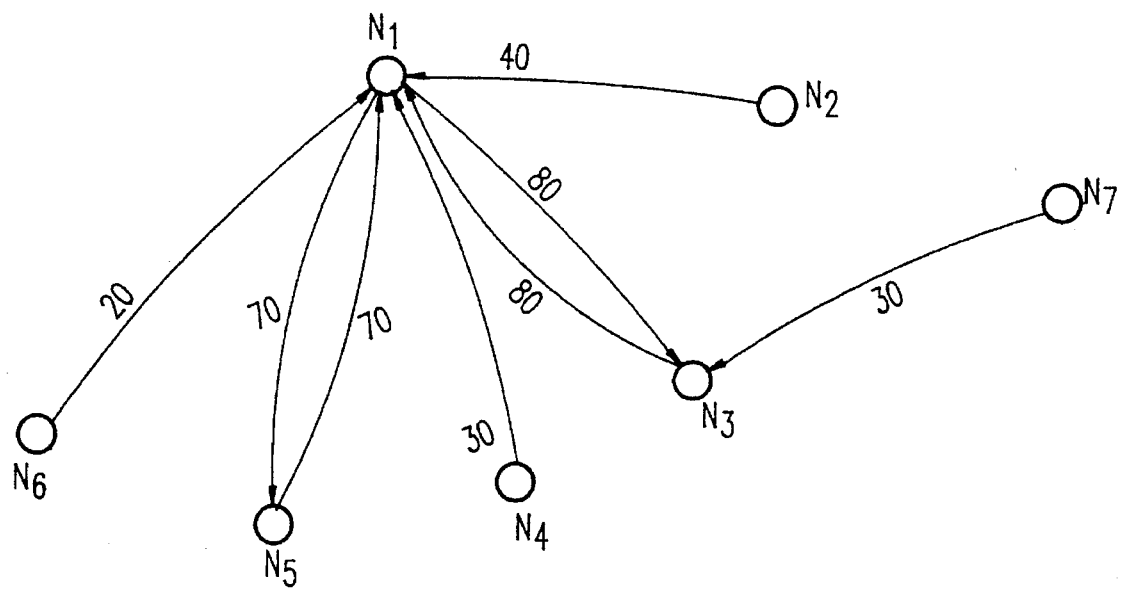
FIG. 1 is a weighted, graphical model, in accordance with the teachings of this invention, of a exemplary seven-net MCM and an accompanying tabulation of active noise and quiet noise for each node.
Figure 2:
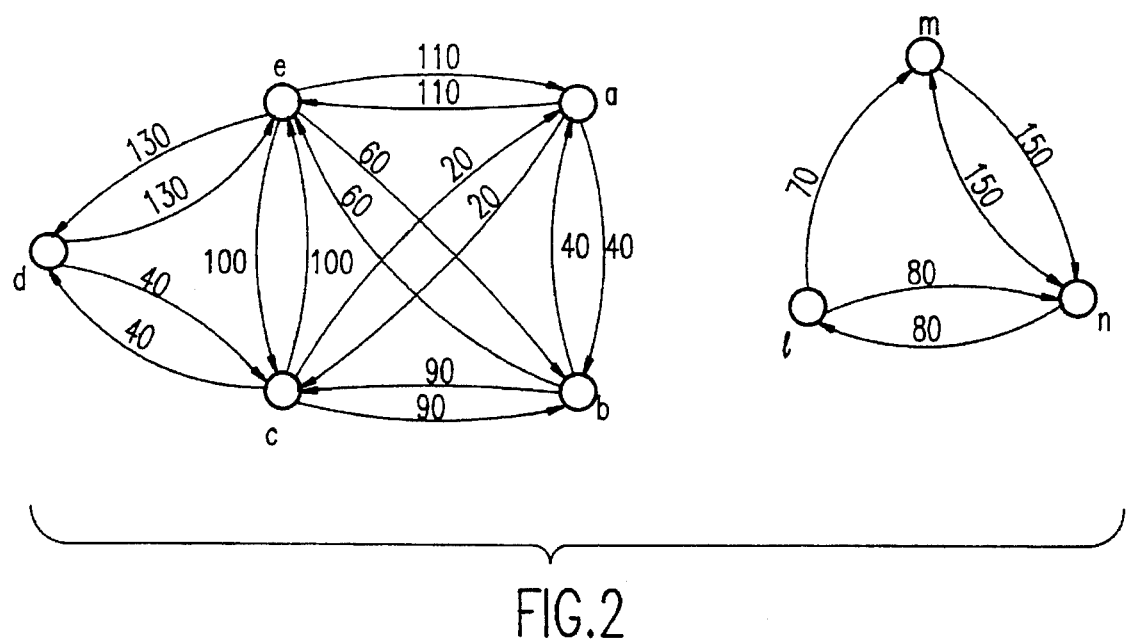
FIG. 2 is a weighted, graphical model similar to FIG. 1, illustrating the fact that in actual practice an MCM may be comprised of two or more separate clusters.

Referring now to the drawings, FIG. 1 shows the graph model for seven nets with coupling noise. The active noise and quiet noise for the seven nets is also given in FIG. 1. Nets and coupled noise between them are represented as a weighted directed graph $G=(V,E)$, where V are vertices and E are edges in the graph G. The set of vertices can be partitioned into two subsets $V_1$ and $V_2$. $V_1$ represents the set of violators and $V_2$ represents the non-violators coupling to the violators. Net $N_i$ is represented as a vertex $V_i$ in the graph. If an active net $N_i$ causes a coupled noise on a quiet net $N_j$, then there is a directed edge from a vertex $V_i$ to vertex $V_j$. The amount of noise is represented as a weight on the edge $(V_i, V_j)$. The amount of quiet noise on a net $N_i$ is the sum of the weights on all the incoming edges into vertex $V_i$ and the amount of active noise of net $N_j$ is the sum of weights on all edges going out of vertex $V_j$. The noise limit (threshold) is assumed to be 60 millivolts (mV). Here, nets $N_1, N_3, N_5$ are noise violators and the remaining nets are coupling non-violators. FIG. 2 shows another noise graph. This illustrates the fact that, in practice, the noise graph usually consists of disjoint components, as shown in FIG. 2.

Figure 3A:
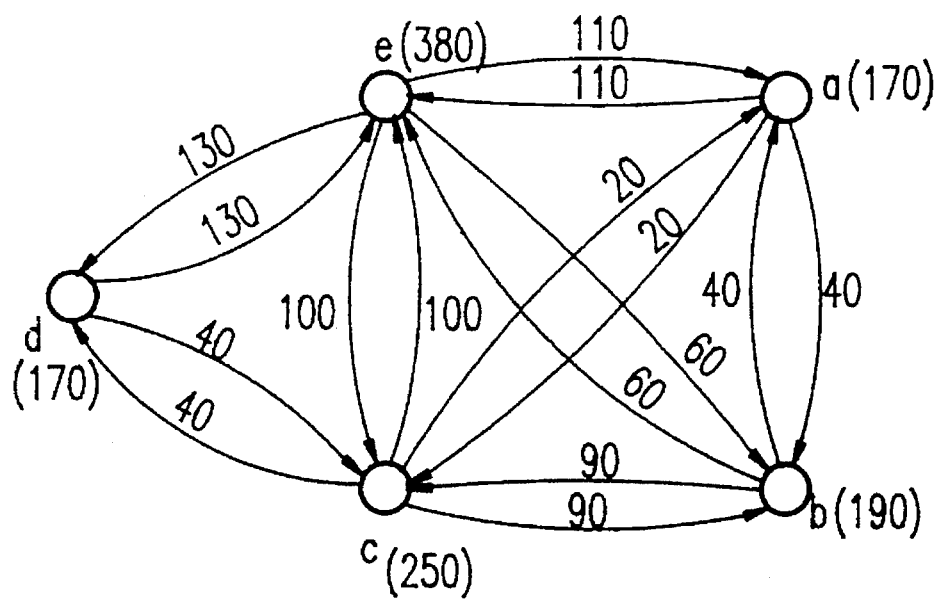
FIGS. 3A and 3B are weighted, graphical models similar to FIG. 1 showing respectively in FIG. 3A a cluster and in FIG. 3B the cluster with one node removed.
Figure 3B:
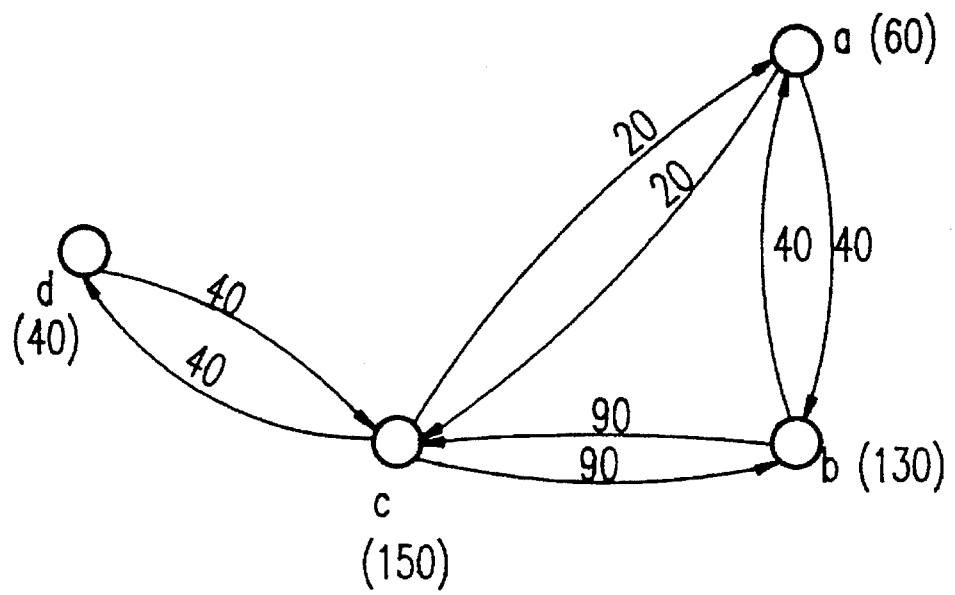

The goal is to identify a subset of the noise violators, whose removal provides that there is no other net that has quiet noise beyond the threshold noise as specified by technology. The process for identifying the nets to be ripped-up and rerouted identifies clusters of nets that are coupled electrically. The clusters are defined by the coupling between the nets. Cluster information is invaluable. Often it is sufficient to delete a small subset of nets in each cluster, to reduce the noise to acceptable levels. So, instead of looking at all the nets, it suffices to look at the individual clusters, and delete a small subset of noise violators in the cluster. For example, consider a cluster from FIG. 2, shown in FIG. 3A. There are five nets (a, b, c, d and e) shown in the cluster, all of which are violators. The noise threshold is assumed to be 160 m. If net e is deleted, it is easy to see that there are no other remaining violators in the cluster, as illustrated in FIG. 3B.

Noise violators are processed based on a priority assigned to each net based on a criterion, that is a function of the noise on the net. A priority queue is a convenient data structure to use. A priority queue is a heap tree in which the priority of any node is greater than the priority of either the left or the right child. The root of the tree has the highest priority of all the nodes in the queue. Any operation on the queue guarantees that, for every node, the priority is greater than the priorities of both the left and right child.

The method is based on greedy heuristics. Noise violators are picked for deletion in an order. A noise-violator initially picked for deletion might eventually become a non-violator, due to subsequent deletion of other noise contributing noise-violators. Hence, non-violators from the deleted set of the original noise-violators are provisionally reinserted after the overall noise level in the MCM is at or below the specified maximum level.

Figure 4:
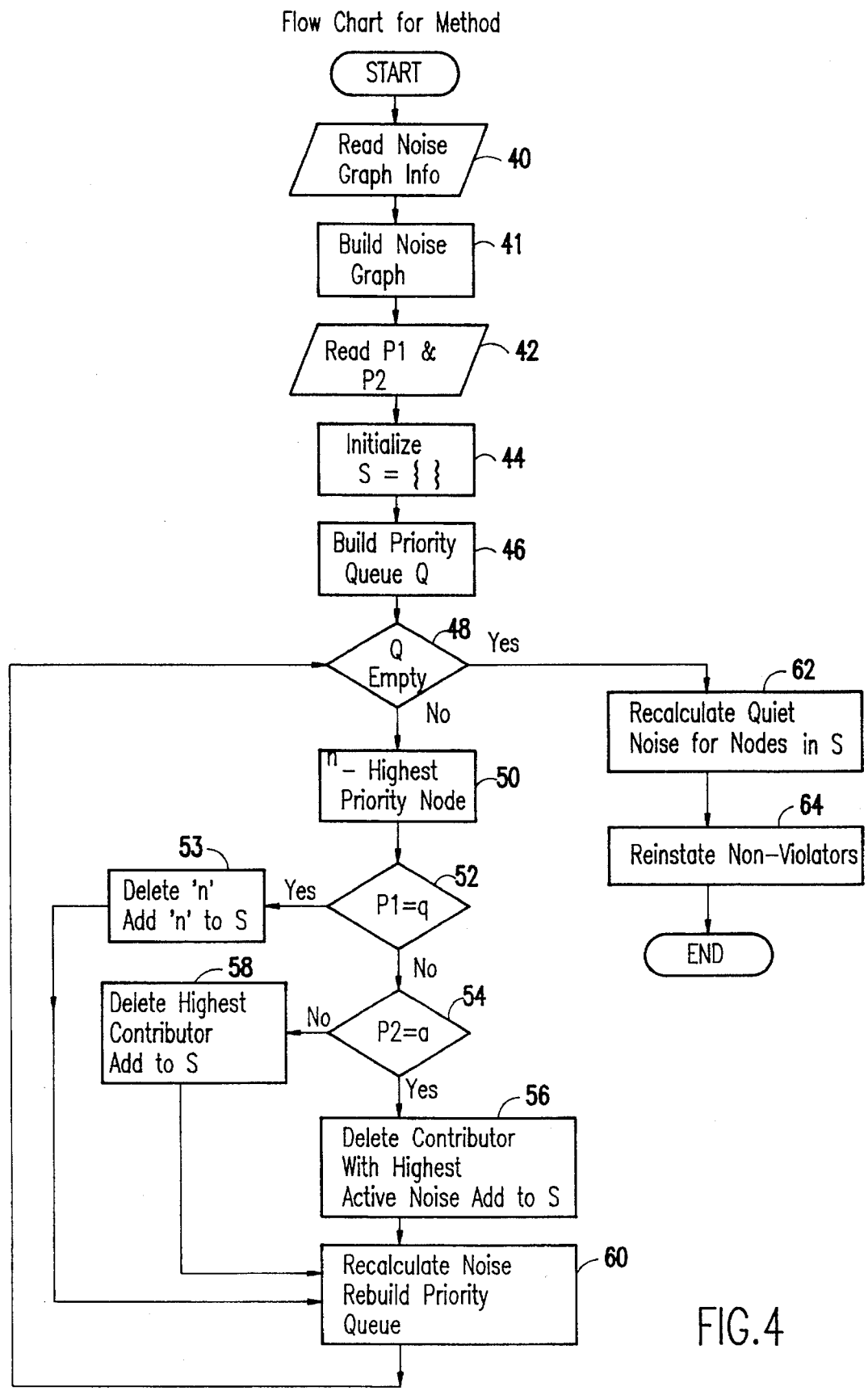
FIG. 4 is a flow diagram of one embodiment of the procedure, in accordance with the teachings of this invention, for identifying a minimal subset of noise violator nets that can be removed to ensure that no net experience quiet noise exceeds a specified amount.

Referring now to FIG. 4, in blocks 40 and 41, the nets and the coupled noise between them are modeled as a weighted, directed graph x=xxxx. The violators and the coupling non-violators form the vertex (node) set, V. The coupled noise between pairs of nets form the edge set, E, as previously described in connection with FIGS. 1–3. In block 42, user defined parameters (P1 and P2) are read that select the control algorithm. One of three possible operating nodes are selected. There are three in which the method operates depending on user specified values for the parameters P1 and P2. For example, if P1= a, then the nets which cause the most noise are deleted, until there are no violators. If P1= q and P2= a, then the noise on a net is reduced by deleting the contributor with the most active noise. The iteration is carried out until there are no noise violators. If P1= q and P2= c, then the net with the highest coupling noise is deleted. The operation is carried out until all nets have acceptable noise levels.

The set of nets identified for deletion S is initialized in block 44. In block 44, the program is initialized by setting S={}, where S is the set of nets to be considered for deletion. Next, in block 46, the nodes are placed in a priority queue Q. The queue is established on the basis of the user selected parameters. If P1=a, the active noise of the corresponding net is used as the priority criteria for the nodes. If P1=q, the quiet noise on the net is used as the priority criteria. In decision block 48, a check is made to see whether or not the queue is empty. If it is not, the program proceeds to pick the highest priority node, n, remaining in the queue at block 50.

If P1=q (block 52), the node is deleted at block 53 along with all edges incident to it and all edges leaving it and the deleted node is added to S, the set of nets identified for deletion. If P1=a (i.e., P1 does not equal q in block 52), then P2 is examined at decision block 54. If P2=a, the contributor with the highest active noise is deleted at block 56, and the deleted node is added to the set S of nets identified for deletion. If P2=c (i.e., P2 does not equal a at block 54), then the net with the highest contributing noise to the node in question is deleted at block 58, and the deleted net is added to S. After each net has been deleted, the quiet noise for all remaining nodes is recalculated and reprioritized at block 60 based on the recalculation, and the program then loops back to decision block 48, where the process is repeated until there are no noise violators, at which time the queue will be empty.

Since noise violators identified for deletion in set S may no longer be a noise violator, after the violators have been initially identified, the quiet noise for all nodes in S is recalculated in block 62, and any non-violators in S are reinstated and deleted from S at block 64.

The above described procedure proceeds until there are no noise violators. If there is a maximum number (D) of violators that can be rewired, as discussed previously, then the program can proceed until there are no noise violators or the limit D is reached, whichever occurs first.

It is to be noted that the above method yield a solution to the Statement 2 discussed in the previous section. The stopping criterion would be different. The methods stop when there are either no violators or a maximum of D violators have been picked for discrete wiring, whichever occurs first.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A computer implemented method for identifying a subset of nets from a plurality of nets in a multi-chip module in order to reduce coupled noise on each net in said multi-chip module to a specified level by rerouting said subset of nets, comprising the steps of:

modeling said plurality of nets as a weighted graph with each net as a node in the graph and noise coupled between pairs of nets as edges between nodes;

prioritizing said nets in a queue as a function of the magnitude of said noise coupled to each net or said noise coupled from each of said nets, as selected by a user;

identifying a net for deletion, starting with a net of a highest priority;

recalculating the noise coupled from each net from other nets and the noise coupled from each net to other nets on a basis that a net of highest priority has been deleted from said multi-chip module; and repeating said prioritizing, deleting and recalculating steps until coupled noise on the remaining nets is reduced to a specified level or a predetermined number of nets have been deleted.

2. The computer implemented method for identifying a subset of nets from a plurality of nets in a multi-chip module as in claim 1, including the step of calculating coupled noise on nets identified for deletion and deleting non-violating nets from those identified for deletion.

3. The computer implemented method for identifying a subset of nets from a plurality of nets in a multi-chip module as in claim 1, wherein the priority criteria is active noise on a net.

4. The computer implemented method for identifying a subset of nets from a plurality of nets in a multi-chip module as in claim 1, wherein the priority criteria is quiet noise on a net.

5. The computer implemented method for identifying a subset of nets from a plurality of nets in a multi-chip module as in claim 2, wherein the priority criteria is active noise on a net.

6. The computer implemented method for identifying a subset of nets from a plurality of nets in a multi-chip module as in claim 1, wherein the priority criteria is quiet noise on a net.

7. A computer implemented method for identifying a subset of nets from a plurality of nets in a multi-chip module in order to reduce coupled noise on each net in said multi-chip module to a specified level by rerouting said subset of nets, comprising the steps of:

modeling the nets and coupled noise between the nets as a weighted graph G=(V,E), where the nets form a vertex (node) set, V, and coupled noises between pairs of nets form an edge set, E;

initializing a set, S, as a set of nets to be deleted from the weighted graph;

building a priority queue of nodes using a magnitude of quiet noise or active noise on a node as a priority as selected by a user;

while there are noise violators in the queue, picking a highest priority node and deleting the node, for a user selected active noise case, or its highest contributor, for a user selected quiet noise case, and adding the deleted node to S, wherein for the quiet noise case, the highest contributor is a node with a largest coupled noise to the node under consideration, or for the active noise case, the highest contributor is the node with a highest amount of coupled noise to other nets, as selected by the user; and recalculating the quiet noise for all nodes and rebuilding the priority queue;

else when there are no noise violators in the queue, calculating the quiet noise for all nodes in S; and reinstating the non-violators from S and deleting any nodes from S which are reinstated.

8. A computer implemented method for identifying a subset of nets from a plurality of nets in a multi-chip module in order to reduce coupled noise on each net in said multi-chip module to a specified level by rerouting said subset of nets, comprising the steps of:

a. modeling the nets and the coupled noise between them as a weighted graph G =(V,E), where violators and coupling non-violators form a vertex (node) set, V, and coupled noise between pairs of nets form an edge set E;

b. reading first and second user defined parameters, P 1 and P2, parameter P1 defining whether active noise or quiet noise controls processing and parameter P2 defining whether active noise of contributors or coupling noise of the contributor is considered when quiet noise controls;

c. initializing a set, S, of nets to be deleted from the weighted graph;

d. building a priority queue, Q, of nodes in V, if P 1 defines that active noise controls, then active noise of the corresponding net is used as priority of a node, else if P 1 defines that quiet noise controls, then quiet noise on the net is used as priority of a node;

e. if Q is non-empty, picking a highest priority node n in V, e1. if P1 defines that quiet noise controls, deleting n and all edges incident into it and edges leaving the node, but if P1 defines that active noise controls, deleting a contributor with a highest active noise if P2 defines that active noise is to be considered, else if P2 defines that coupling noise is to be considered, deleting a contributor with the highest contributing noise to the node n in question, e2. adding the deleted node to S, e3. recalculating quiet noise for all nodes and rebuilding the priority queue; and f. else, if Q is empty, f2. calculating quiet noise for all nodes in S, and f3. reinstating non-violators from nodes in S, and if any node is reinstated, deleting a reinstated node from S.

* * * * *